United States Patent
Farnworth

(10) Patent No.: US 7,491,636 B2
(45) Date of Patent: Feb. 17, 2009

(54) METHODS FOR FORMING FLEXIBLE COLUMN DIE INTERCONNECTS AND RESULTING STRUCTURES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 492 days.

(21) Appl. No.: 11/184,119

(22) Filed: Jul. 19, 2005

(65) Prior Publication Data
US 2007/0020916 A1 Jan. 25, 2007

(51) Int. Cl.
*H01L 21/44* (2006.01)
(52) U.S. Cl. .............................. 438/598; 257/E21.575; 438/618
(58) Field of Classification Search ................. 438/117, 438/619, 598, 618; 257/E21.575
See application file for complete search history.

(56) References Cited

U.S. PATENT DOCUMENTS

| | | | |
|---|---|---|---|
| 6,313,540 B1 * | 11/2001 | Kida et al. | 257/784 |
| 6,417,029 B1 | 7/2002 | Fjelstad | |
| 6,479,374 B1 * | 11/2002 | Ioka et al. | 438/601 |
| 6,555,759 B2 | 4/2003 | Tzanavaras et al. | |
| 6,635,514 B1 | 10/2003 | Fjelstad | |
| 6,774,317 B2 | 8/2004 | Fjelstad | |
| 6,791,169 B2 | 9/2004 | Carson | |
| 6,828,669 B2 | 12/2004 | Smith et al. | |
| 2003/0075792 A1 * | 4/2003 | Ruhland | 257/693 |
| 2005/0208280 A1 * | 9/2005 | Dias et al. | 428/209 |

OTHER PUBLICATIONS

Jagannathan et al., Electroless Plating of Copper at a Low pH Level, IBM J. Res. Develop., vol. 37 No. 2, Mar. 1993, pp. 117-123.
Cookson Electronics, Enthone, http://www.enthone-omi.com/resources_detail.aspx, visited Jun. 30, 2005, 8 pages.
Transene Company, Inc., Immersion Gold CF Cyanide-Free Electroless, http://www.transene.com/immersion_gold.html, visited Jun. 30, 2005, 1 page.
Transene Company, Inc., Bright Electroless Gold, http://www.transene.com/au.html, visited Jun. 30, 2005, 1 page.
Transene Company, Inc., Copper Plating Acid Type, http://www.transene.com/copper_plating.html, visited Jun. 30, 2005, 1 page.

(Continued)

*Primary Examiner*—Asok K Sarkar
(74) *Attorney, Agent, or Firm*—TrackBritt

(57) ABSTRACT

A flexible column interconnect for a microelectronic substrate includes a plurality of conductive columns extending from a bond pad or other conductive terminal in substantially mutually parallel arrangement, providing redundant current paths between the bond pad and a common cap in the form of a contact pad to which they are all joined. The flexibility of the interconnect may be varied by controlling the column dimensions, height, aspect ratio, number of columns, column material and by applying a supporting layer of dielectric material to a controlled depth about the base of the columns. A large number of interconnects may be formed on a wafer, partial wafer, single die, interposer, circuit board, or other substrate.

31 Claims, 7 Drawing Sheets

OTHER PUBLICATIONS

Transene Company, Inc., PC Electroless Copper, http://www.transene.com/cu.html, visited Jun. 30, 2005, 1 page.

FujiFilm, Photoresist, http://www.archmicro.com/Products/PhotoResist.aspx, visited Jun. 30, 2005, 5 pages.

Futurrex Productivity Tools, Positive Resists, http://www.futurrex.com/posphotores.html, visited Jun. 30, 2005, 1 page.

Futurrex Productivity Tools, Negative Resists, http://www.futurrex.com/negphotores.html, visited Jun. 30, 2005, 1 page.

* cited by examiner

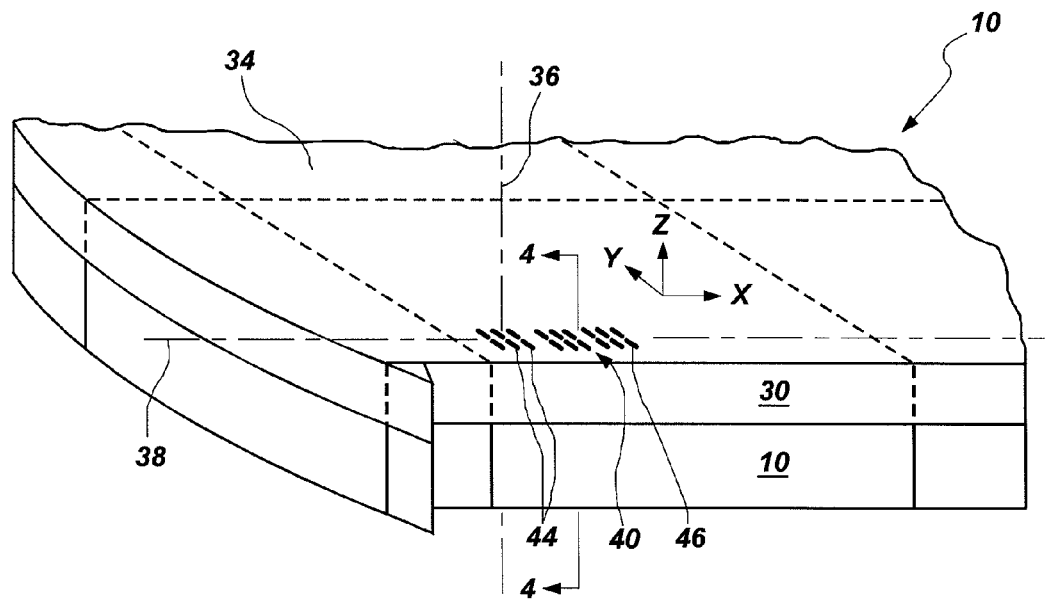
FIG. 3
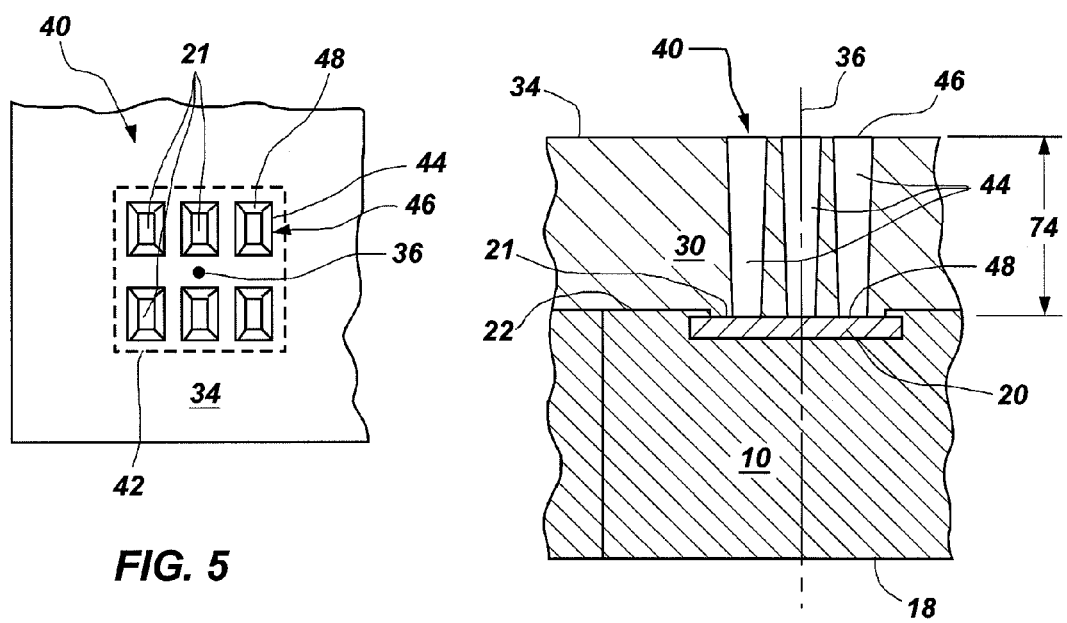
FIG. 5
FIG. 4

FIG. 5A   FIG. 5B   FIG. 5C   FIG. 5D

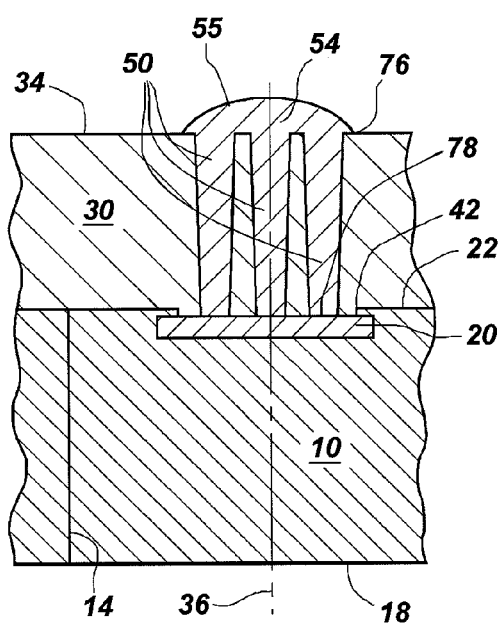
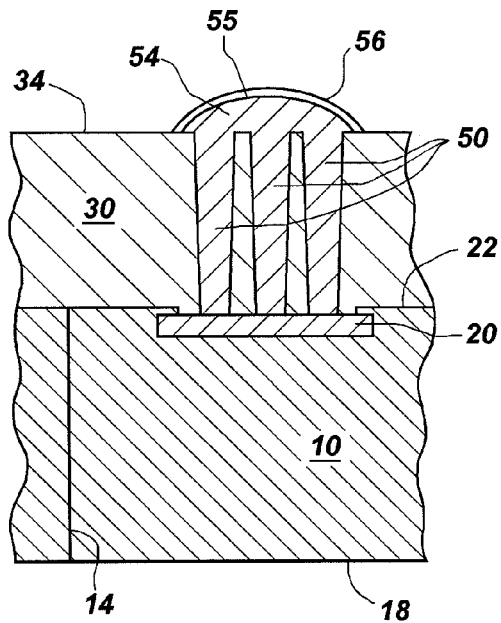
FIG. 6
FIG. 7
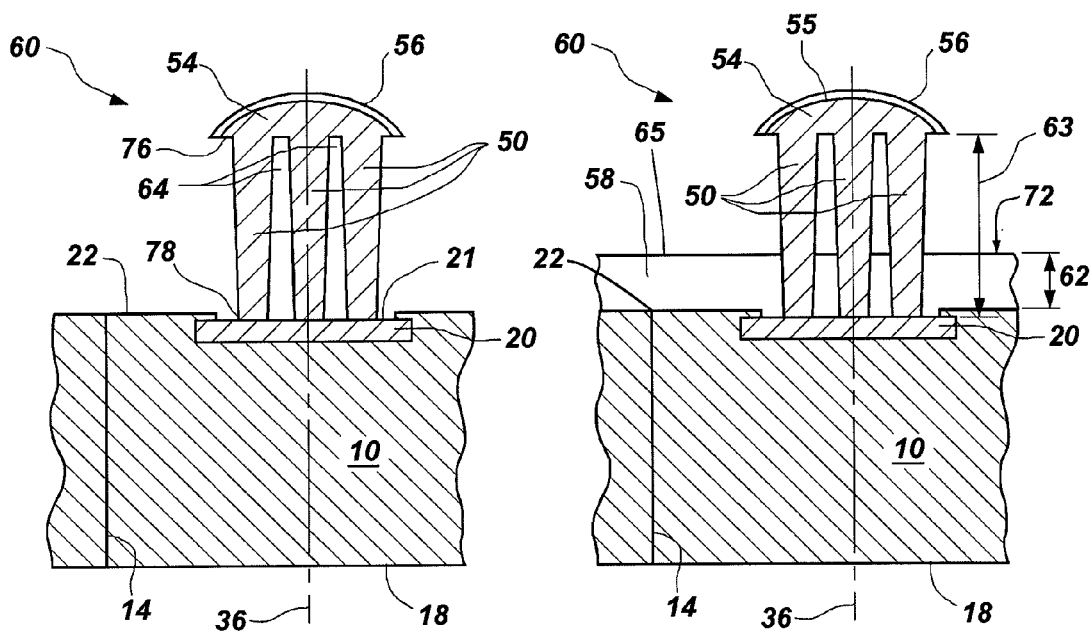
FIG. 8
FIG. 9

METHODS FOR FORMING FLEXIBLE COLUMN DIE INTERCONNECTS AND RESULTING STRUCTURES

BACKGROUND OF THE INVENTION

1. Field of the Invention

The present invention relates to semiconductor devices and fabrication methods therefor. More particularly, the invention pertains to structures for proving electrical interconnections between electronic components and methods for forming such structures.

2. State of the Art

Semiconductor devices that include integrated circuits are produced by fabricating a plurality of substantially identical integrated circuit (IC) patterns on a semiconductor wafer. Each circuit pattern defines an integrated circuit of an individual semiconductor die. A plethora of processes is typically used to form the integrated circuits, including for example, doping, photolithography, layering, etching, laser ablation, metallization, oxidation, layer removal, wafer thinning/planarization, die singulation, testing (before and after singulation) and packaging. Inasmuch as the major goals of semiconductor manufacturers are increased performance and lower cost, considerations such as device density (with concomitant higher circuit speeds and reduced power requirements) and enhanced reliability have assumed a high priority. The proliferation of hand held apparatus such as cellular phones, global positioning satellite (GPS) units, entertainment devices, electronic cameras, personal digital assistants (PDAs), and the like has demanded electronic circuitry of ever-reduced size and enhanced capabilities.

Complex microelectronic devices may require hundreds, or even thousands, of input and output connections between electronic components. These connections may be area-arrayed, for example, on the active surface or back side of a semiconductor die for accommodating solder balls and/or spaced in a row or rows on the active surface, e.g., along the periphery thereof or in a central region thereof. Various prior art processes for producing interconnections between electronic components such as, for example, semiconductor dice and carrier substrates such as interposers and circuit boards use prefabricated arrays or rows of leads, discrete wire bonds, solder or other conductive bumps, tape automated bonding (TAB), edge connections, and combinations thereof.

In a wirebonding process, a semiconductor substrate such as a semiconductor die with bond pads is physically supported. A fine wire is fed through a capillary of a wire bonding tool, whereby one end of the wire at the distal end of the capillary head makes contact with a bond pad and is bonded thereto, typically using thermal or ultrasonic energy or a combination thereof. The capillary head is then moved to another location while wire is fed therefrom to a second pad or lead finger of another (or the same) substrate, the wire being bonded to the second location and then severed. The process is repeated for each bond pad of the semiconductor substrate, making interconnection very time-consuming and, as bond pad and lead sizes shrink, ever more prone to error.

In tape-automated bonding (TAB) methods, a dielectric tape, such as is made of polyimide carries an array of metallic leads on one surface thereof, the leads having ends which are exposed through one or more apertures formed in the tape. The opposing ends of the leads are bonded to bond pads of a die and terminal pads at the end of traces on a carrier substrate, typically by ultrasonic or thermocompression bonding, and the outer ends are connected to external circuitry. Ultrasonic bonding and thermocompression bonding generate heat which may damage the circuitry and, again, as bond pad and trace sizes shrink, defective bonding becomes more likely.

In addition to forming reliable connections between electrical components, a significant goal in the semiconductor industry is to perform as many of the manufacturing operations as possible on an entire wafer prior to die separation (singulation), in order to speed production, enhance yields to reduce production costs, and increase device uniformity and reliability.

One of the critical limitations in the production of microelectronic assemblies relates to electrical interconnection of an IC device to another apparatus such as an interposer, test carrier, circuit board, another IC device, or other substrate or higher-level packaging. For example, a test carrier for testing a semiconductor component such as a bare semiconductor die or a chip scale package often includes contacts for making temporary electrical connections with external contacts, such as bond pads or conductive bumps, on the semiconductor component being tested. The test carriers themselves are typically connected to a test board and associated test circuitry by conductive pins or pads.

An inner lead bond (ILB) pattern on the active surface of a semiconductor die may include contacts in the form of (typically aluminum or aluminum alloy) bond pads, which are very small, e.g., 100-200 µm square, very closely spaced or "pitched" (typically along or adjacent a center line of the die or along the periphery of the die in the X-Y plane). As a result, it may be difficult to connect the inner lead bond pads with terminal pads of another substrate. Thus, wire bonding may be difficult, as may probe testing or burn-in of the semiconductor device.

In addition, compressive force along the Z axis (perpendicular to the active surface of the semiconductor substrate) may be used to achieve the desired electrical contact during probe testing and burn-in. Such forces may result in lifting and separation of bond pads from the active surface, particularly if all of the bond pad surfaces do not lie in the same plane, so that some bond pads undergo greater force from a probe needle, pin or other contact than other, more recessed ones contacted by probe needles, pins or other contacts carried by the same contact head. A similar effect may result from thermal expansion and contraction of the bond pads and connectors during manufacture, testing and use. Furthermore, as commonly practiced, the aluminum bond pads are electroless plated with nickel; the plating process tends to pull and curl the pad edges away from the die.

To electrically connect another substrate to the small contacts in the ILB pattern, the bond pads of the ILB pattern may be redistributed to other locations on the active surface using a redistribution layer (RDL) comprising conductive traces extending from the bond pads to an outer lead bond (OLB) pattern that includes terminal pads which are typically about 240 µm square and more widely pitched. Thus, interconnection to another substrate may be made with much fewer defects. However, the formation of the RDL traces and terminal pads requires at least one extra step of fabrication to form the RDL traces and a passivating layer thereover, and adds time and material expenses to the overall manufacturing process.

A method for forming flexible interconnections is shown in U.S. patents to Fjelstad, i.e., U.S. Pat. No. 6,417,029 issued Jul. 9, 2002 and U.S. Pat. No. 6,774,317 issued Aug. 10, 2004. As shown in these references, a flexible support structure is attached to a conductive sheet. The conductive sheet is selectively removed by etching, leaving "cooling tower" shaped posts with coplanar tips relative to each other. Each post becomes an interconnection which may be wire-bonded to an underlying microelectronic device. Flexibility is given to the array of posts by the flexible support structure.

In U.S. Pat. No. 6,635,514 to Fjelstad, issued Oct. 21, 2003, a method for compliantly connecting bond pads of a first substrate to connectors of a second substrate is described. Connecting posts are formed of a conductive elastomeric material.

As shown in U.S. Pat. No. 6,828,669 issued Dec. 7, 2004 to Smith et al., flexible interconnection components between substrates comprise conductors bent into an S-shape which are attached in a non-aligned manner and the space therebetween filled with a pliant layer.

U.S. Pat. No. 6,791,169 issued Sep. 14, 2004 to Carson discloses an interconnect in which spring-like S-shaped conductive elements extend through an interposed layer of an anisotropic conductive material.

In U.S. Pat. No. 6,555,759, issued Apr. 29, 2003 to Tzanavaras et al., singular compliant conductive bumps are formed on metallized bond pads and surrounded by a supporting layer such as a polymer.

None of the cited prior art patents provides a method for forming an interconnect completely in the wafer stage, with determinable, controllable and known flexibility and with much reduced possibility of thermal mismatch-caused damage. Such an interconnect would be desirable to employ in the semiconductor industry to achieve the desired miniature size and density of electronic devices.

Efforts by the inventor to overcome the disadvantages of the prior art with respect to substrate-to-substrate interconnect systems which are compliant or flexible have led to apparatus and methods of the invention, several exemplary embodiments of which are summarized, described in detail, illustrated and claimed as follows:

BRIEF SUMMARY OF THE INVENTION

The present invention comprises a conductive, multi-column interconnect for electrically connecting electronic substrates to each other as well as methods for making the interconnect. The interconnect of the present invention is noted herein to be a "flexible column die interconnect" (FCDI) although it may be used to join substrates other than semiconductor dice. Each individual interconnect comprises a plurality of generally parallel, conductive columns which have first ends (base ends) joined to a bond pad on a first substrate, and distal ends joined to an outer contact pad supported thereby. The outer contact pad is spaced distally from the bond pad to any desired degree, and the outer contact pads of a substrate are readily formed with outer contact surfaces coplanar with respect to each other. The outer contact pad may be formed integrally with the supporting columns and have the same or a compatible composition. The multiple columns provide a redundancy in current paths to maintain electrical connection even in the event that stress-caused disconnection of one or more of the columns from the bond pad occurs. As formed, each of the columns of the interconnect possesses a determinably degree of flexibility, laterally as well as axially, and the multi-column structure of the interconnect provides an overall controlled degree of flexibility of the outer contact pad. The flexibility in multiple directions may be tailored to a particular application to avoid high-temperature damage caused by mismatches in the coefficient of thermal expansion (CTE) between components and sub-components of semiconductor device and other electronic component assemblies, and the columns may be placed and grouped to provide enhanced lateral, or shear, flexibility in a preferential direction such as, for example, toward a centroid of a semiconductor die or other substrate on which the interconnect has been formed to accommodate such mismatches.

The contact pad-supporting columns may be formed to have uniform cross-sectional dimensions, or alternatively be non-uniform. In the latter case, for example, the cross-section dimensions of a column may generally increase (or alternatively decrease) with distance from the base of the column where it is connected to the bond pad on the substrate. The cross section of a column may be of any shape, including, without limitation, for example, generally rectangular, e.g., square, a parallelogram, trapezoidal, circular, elliptical, or other shape. Any shape may be used which will provide a controlled degree of lateral flexibility, vertical flexibility or both lateral and vertical flexibilities. The plurality of columns may be configured to provide differing degrees of flexibility in the X, Y and Z axes, and in intermediate (oblique) directions, in order to provide sufficient flexibility to prevent interconnect disconnection or breakage, and without risking excess flexibility which may lead to lateral contact between adjacent interconnects.

Axial, lateral and torsional flexibilities (and combinations thereof along other vectors therebetween) of the column-supported contact pad are functions of the number of supporting columns, column height, the cross-sectional dimensions of each column (in particular, the minimum cross-sectional area), adhesion of the columns to the bond pad, and mechanical properties of the column material. Although a metal such as copper or copper alloy may be a material of choice to form columns for many applications, any conductive material with the desired chemical characteristics and mechanical properties may be used to form the columns, including, for example, even non-metals and metal-containing polymers.

In a further embodiment of the interconnect of the present invention, a layer of dielectric material may be placed to overlie the substrate surface, surrounding and further supporting the column bases to control the column length which may flex without lateral constraint. Thus, the net lateral, axial and torsional flexibilities of a contact pad may be tailored to desirable values by use of a dielectric material of a selected depth and resiliency (if any). The dielectric layer also acts to prevent column flex at the joint or junction with the bond pad at the lower end of a column, reducing forces acting on the joint and tending to loosen or break the column-to-bond pad connection. Thus, the column bases which provide redundant conductive paths are reinforced by the dielectric material. In addition, the dielectric material provides a passivation layer which protects the substrate and electrical connectors from physical and electrical damage in manufacture, testing and use of the substrate on which they are carried.

The invention also comprises methods for making such capped flexible column die interconnects in substrates such as semiconductor wafers, interposers, test cards, circuit boards, individual semiconductor dice, and the like.

In one embodiment of the methods of the invention, the acts used to make the FCDI may be generally described as providing a substrate having a surface with at least one bond pad or conductive terminal site, applying a layer of resist material over the substrate surface to cover the bond pad/terminal to a desired uniform depth, patterning and developing the resist material to form a plurality (for example, two to nine) of depressions or blind holes extending from the resist surface to the upper surface of the bond pad, the depressions/blind holes being, in one implementation, generally mutually parallel, filling the depressions/blind holes with a non-brittle conductive material (metal, non-metal or combination thereof) to form a plurality of columns having first ends (base ends) conductively and physically connected to the bond pad, continuing deposition of a conductive material to form a contact pad conductively and physically connected to the second, outer ends of the plurality of columns and stripping the resist from the substrate surface.

The capped multiple column interconnect so formed will exhibit a substantially increased flexibility in both the lateral and axial directions, as compared to the bond pad on which they are formed. In one embodiment, an additional act may be performed wherein a layer of dielectric passivating material, e.g., polymer, is deposited at a controlled depth to uniformly cover the substrate surface including exposed portions of the bond pad about and between the plurality of columns. The passivation layer is cured to mitigate the increased flexibility provided by the columns to a desired flexibility value, protect the column-to-bond pad connection, and to passivate the surface. The degree of mitigation is dependent upon the depth and rigidity (or pliancy) of the cured passivation layer which confines movement of each column.

The method may be further modified by depositing another conductive, metallic layer, e.g., by electrolytic or electroless plating, to the outer surface of the contact pad for the purpose (s) of increasing solder "wettability," strength enhancement, increased wearability and abrasion resistance or other purpose or combination thereof. For example, nickel may be plated over a contact pad of copper or other conductive material. This plating act may be easily performed before the layer of resist is stripped from the substrate surface. If the plating is conducted after stripping of the resist, the column surfaces will also become plated. In this case, the column plating must be taken into account if the mechanical properties of the columns are significantly affected. As an example, a copper contact pad may be plated with nickel after the underlying columns are exposed, increasing the cross-sectional area of the contact pad and decreasing the flexibility of the supporting columns due to the copper plating thereon.

In another embodiment of the invention, a second resist layer is deposited and patterned to limit the contact pad so formed to a defined shape and size which prevents contact and short circuiting between contact pads or between a contact pad and another conductive member. The method is particularly useful where the bond pads on a substrate are small and have a small pitch and/or are closely spaced. This embodiment of the method comprises providing a substrate having a surface with at least one bond pad, applying a first layer of resist material over the substrate surface to cover the bond pad to a desired uniform depth, patterning and developing the resist material to form a plurality (for example, two to nine) of depressions or holes extending from the resist surface to the bond pad, filling the depressions/holes with a non-brittle conductive material (metal, non-metal or combination thereof) to form a plurality of columns having first ends (base ends) joined to the bond pad, applying a second layer of resist over the first resist layer and exposed column ends, patterning and developing the resist material to form an aperture through the second layer of resist exposing the second, outer ends of the columns and of a desired shape and size of a contact pad, depositing conductive material in the aperture to form a contact pad or cap joined to the second end of each column and stripping the resist layers from the substrate surface.

As in the first embodiment described above, a further act of depositing a dielectric layer over the substrate surface may be performed, wherein the lateral and axial flexibilities of the columns are mitigated to desired values, the column-to-bond pad connections are reinforced and the substrate surface is passivated. Further, as in the first embodiment, a layer of a different material may be applied over the contact pad.

Although not generally required, a separate planarization act following resist deposition may be performed to planarize a resist layer, depending upon the precision of the deposition method and the particular planarity requirements of the contact pads formed in the process of the invention.

The entire FCDI-forming process may be completed at the wafer stage to reduce both processing time and expense. The present invention may be used to provide uniform-height interconnects on a substrate exhibiting a controlled degree of flexibility and redundancy, the architecture of the interconnects reducing any tendency toward disconnection and short circuiting occurring in manufacture, test and use due to mismatches in thermal expansion of components and subcomponents.

An additional benefit of the present invention is the ease with which a damaged interconnect may be repaired, by etching down to the bond pad and using the acts outlined above to reform an interconnect of the invention.

The contact pad size and shape and surface characteristics may be varied to provide a convenient base for temporary contact with, e.g., test needle, pin or other contact, or for effecting a permanent connection to another substrate. Thus, the invention is useful for simulating conventional column grid array (CGA), ball grid array (BGA), and other types of interconnection between stacked dies in a multi-chip module (MCM).

The exemplary methods described herein are shown as relating to a single flexible column die interconnect for a single bond pad; however, in actual practice, the methods will generally be applied to the interconnection formation on a multi-die wafer comprising hundreds (or thousands) of unsingulated semiconductor dice. The method obviates the use of wire bonds and permits the formation of high density devices. The invention may be applied to interconnection for electronic apparatus such as semiconductor devices including optoelectronic devices, test apparatus such as contact heads, and the like.

Of the invention, the above method may be varied to accommodate particular situations, such variations falling within the purview of the invention.

The methods of the invention are advantageous in the production of stacked die devices, such as stacked processors, DRAMs, SRAMs, PCRAMs, MRAMs, CAMs, flash memory devices, imagers stacked with other dice, and other assemblies.

The methods of the invention have substantial advantages over the prior art. Each of the steps uses known and well-developed technology. The method enables the production of high density multi-chip modules (MCM). Use of the methods avoids problems known in the prior art. Furthermore, the steps of interconnect formation may be conducted at the wafer stage, wherein each process act of the method may simultaneously encompass all of the individual but unsingulated semiconductor dice on the wafer.

Other features and advantages of the present invention will become apparent to those of skill in the art through consideration of the ensuing detailed description, the accompanying drawings, and the appended claims. The drawings are idealized representations for better illustration of the methods of the invention, and various elements are not necessarily shown to scale.

BRIEF DESCRIPTION OF THE SEVERAL VIEWS OF THE DRAWINGS

In the drawings, which depict exemplary embodiments of various features of the present invention:

FIG. 3 is a perspective view of a substrate structure of FIG. 2 following the formation of a plurality of openings through the resist material to the surface of each bond pad of an act of a method of the invention;

FIG. 4 is an enlarged cross-sectional lateral view of a portion of an exemplary substrate structure having a plurality of openings extending to a bond pad, as taken along lines 4-4 of FIG. 3;

FIG. 5 is an enlarged plan view of a plurality of openings extending to a bond pad of a substrate structure, of an embodiment of the method of the invention;

FIGS. 5A, 5B, 5C and 5D are enlarged plan views of four exemplary pluralities of openings extending to a bond pad of a substrate structure, of differing embodiments of a method of the invention;

FIG. 6 is a cross-sectional lateral view of a portion of an exemplary substrate structure of FIG. 5 following an act of filling each of a plurality of the openings with a column of conductive material extending to a bond pad, and forming a conductive contact pad connecting the second, outer ends of the columns, of an act of a method of the invention;

FIG. 7 is a cross-sectional lateral view of a portion of an exemplary substrate structure of FIG. 6, following an optional act of plating the contact pad with another conductor of a method of the invention;

FIG. 8 is a cross-sectional lateral view of a portion of an exemplary substrate structure of FIG. 7, following an act of stripping the resist layer from the active surface, of a method of the invention;

FIG. 9 is a cross-sectional lateral view of a portion of an exemplary substrate structure of FIG. 8 following an optional act of deposition of a dielectric material on the active surface and around the columns to mitigate flexibility of the contact pad and form a flexible column die interconnect (FCDI) having a desired flexibility, of a method of the invention;

DETAILED DESCRIPTION OF THE INVENTION

The present invention comprises interconnects for microelectronic apparatus and methods for forming same. In particular, the interconnect of the invention provides a conductive contact pad positioned above a conductive terminal, e.g., bond pad on the surface of a substrate structure. The interconnect is redundantly connected to the conductive terminal of a substrate structure by a plurality of supporting conductive columns. The interconnect is configured so that the flexibility of the contact pad in lateral and axial directions is determined by design considerations to provide for a desired, pliant degree of movement in at least one direction without the hazard of short circuiting with another conductor. The interconnect of the invention is identified herein as a flexible column die interconnect (FCDI) and is applicable to provide temporary or permanent electrical connection between a substrate such as a semiconductor die having bond pads or other terminals thereon and conductors of another substrate structure including for example, another die, a test apparatus, a circuit board, an interposer or the like. In the following discussion, the conductive terminal upon which an interconnect of the present invention is formed will for convenience be denoted as a "bond pad" or "terminal pad" but may comprise any conductive element on a surface which is to be interconnected to another terminal of another, associated substrate structure.

Turning now to the figures of the drawings, methods for forming a "flexible column die interconnect" (FCDI) 60 (see FIG. 10) on a substrate structure 10 such as a multi-die semiconductor wafer and the resulting FCDI are illustrated and described, infra.

Figure 1:
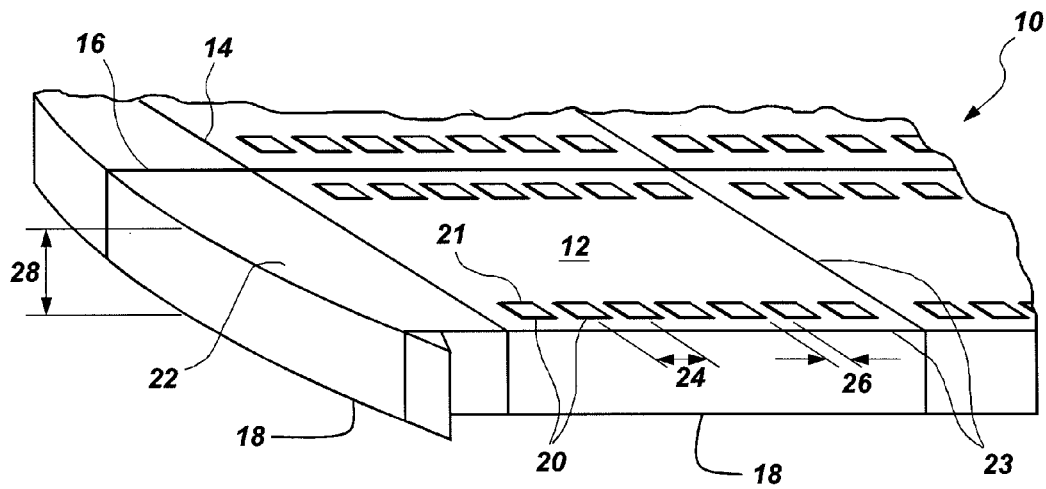
FIG. 1 is a perspective view of a substrate structure exemplified as a portion of a semiconductor wafer having patterns of peripheral conductive bond pads for each semiconductor die location on an active surface thereof, for illustrating methods for forming flexible column die interconnects (FCDI) of the invention.

In FIG. 1, a portion of an exemplary substrate structure 10, i.e., a semiconductor wafer having a thickness 28, is shown in a partially completed stage, wherein, for example, integrated circuits are formed in the substrate active surface 22, e.g., the active surface encompassing each die 12, and terminate in a plurality of bond pads 20. Each die 12 of the substrate structure 10 is defined by X-axis cut lines or "streets" 16 and Y-axis cut lines or "streets" 14 wherein the die (chip) is subsequently separated or "singulated" from adjacent dies. In this discussion, the intersection of the cut lines 14, 16 with the substrate surface represent the peripheral edges 23 of the active surface 22. Bond pads 20 are shown with upper (exposed) bond pad surfaces 21 for interconnection to connectors of another substrate or higher-level packaging, not shown. Typically, bond pads 20 are formed in a pattern comprising one or more straight rows on a die's active surface 22, either near peripheral edge(s) 23 or in a generally central line across the die 12. For example, in FIG. 1 the bond pads 20 are shown in two opposing peripheral rows with pitch 24 and spacing 26 between adjacent pads. However, the interconnect of the present invention is equally applicable to a redistributed, two-dimensional array of bond pads, terminating at outer lead bonds (OLBs) of a redistribution layer (RDL), as described above. The present invention is, thus, applicable to any arrangement of bond pads 20 on a substrate surface, and to a variety of bond pad shapes and sizes. Use of the interconnect of the present invention enhances reliability with the use of closely spaced bond pads 20. Thus, for example, current technology permits use of the invention with bond pads 20 having upper bond pad surfaces 21 of 200×200 µm, 100×100 µm, or smaller dimensions. The substrate structure 10 is shown with a back side 18, which may be coated with a passivating layer (not shown) or may include another pattern of bond pads 20 (not shown) associated with conductive vias extending through substrate structure 10 from one side to the other, to enable stacking and electrical connection of two or more substrate structures joined, for example, in a multi-chip module by methods of the invention.

Not shown in FIG. 1 are layered components within the active surface 22 such as, for example, active electronic devices comprising integrated circuits, conductive traces comprising layers of so-called metallization, conductive leads, layers of dielectric materials, etc., all of which are well-known to those of ordinary skill in the art to be part of an exemplary semiconductor device.

The acts of the methods described below and illustrated in the drawings are not exhaustive of the methods. For example, various cleaning acts may be used in the methods; such are not shown or described, but are in fact well-known to those of ordinary skill in the art.

Figure 2:
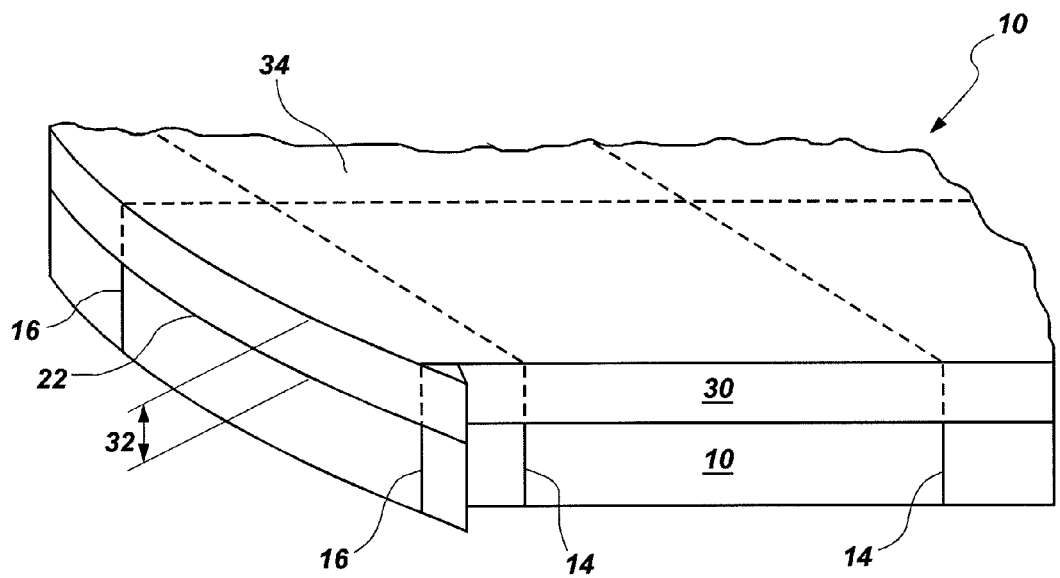
FIG. 2 is a perspective view of a substrate structure of FIG. 1 following deposition of a layer of resist material to cover the semiconductor active surface including bond pad(s), of a step of a method of the invention.

In a method of the present invention, a photolithographic process is implemented to form mold cavities 44 (FIG. 3) for creating a plurality of generally parallel columns extending upwardly (relative to the surface of substrate structure 10) from a bond pad 20. Thus, the exposed active surface 22, e.g., active surface of a substrate structure 10 including bond pads 20 having the edges thereof covered by a portion of a surrounding passivation layer to define an aperture shown in broken lines 42 (not separately shown from the underlying substrate) is blanket-covered with a relatively thick first resist layer 30 of a resist material, e.g., photoresist, as depicted in FIG. 2. The first resist layer 30 is deposited to a thickness 74 (FIG. 4) which determines the overall length 63 (see FIG. 9) of each conductive column 50 of the calumniated FCDI 60. The first resist layer 30 is formed with a substantially planar surface 34, using a method such as spin deposition. Any resist material may be used which may be applied in a highly planar manner, patterned, and developed to uniformly create a plurality of mold cavities 44, also known as blind holes or openings, or merely "holes." Conventional positive or negative photoresist materials which may be conventionally patterned by photolithographic techniques and then developed to define holes 44, are entirely suitable for the inventive process. The blind holes or cavities 44 (in the first resist layer 30) extend from the planar surface 34 to bond pad surface 21 of a bond pad 20 (or equivalent conductor surface) on the substrate structure 10. Each blind hole 44 exposes a portion of a bond pad surface (See FIGS. 3, 4 and 5), by which a formed conductive column 50 is conductively joined to the bond pad 20. Thus, conventional positive and negative photoresist materials such as those available from, by way of example only, Futurrex, Inc. of Franklin, New Jersey and FujiFilm Electronic Materials Inc. of North Kingstown, Rhode Island may be used. Other types and systems of resist patterning, as known in the art, may be used to achieve a desired hole pattern 40. Although holes 44 may have a wide variety of alternative shapes, the process may be carried out in a most straightforward manner to provide predictable flexibility to form holes 44 having a square, rectangular, circular or oval cross section and a longitudinal shape which is equal in size or somewhat larger at the open end 46 at planar surface 34 than at the base end 48 where it exposes the surface 21 of bond pad 20. The cross-sectional shape of the hole 44 may be of any configuration which will provide a desired flexibility. From a practical standpoint however, there is generally no advantage to forming holes with other than relatively simple shapes.

As seen in FIGS. 3, 4 and 5, the hole pattern 40 comprises a plurality of holes 44 extending through the first resist layer 30 to a bond pad 20. The hole pattern 40 is shown as comprising an exemplary 3×2 configuration or array of holes 44, with each of the six holes 44 having a cross section greater in the Y dimension than in the X dimension. The hole pattern 40 and the underlying bond pad 20 are shown with a common center line 36 in the Z-axis. The hole pattern 40 may optionally be slightly offset (laterally) from the underlying bond pad 20, as long as the base ends 48 of the holes 44 expose portions of bond pad surface 21 of the bond pad 20.

Typically, a substrate structure 10 may have a large number of bond pads 20 which require external electrical connection. Thus, for example, a wafer scale hole pattern (not shown in full) may encompass hundreds or thousands of bond pads 20 on a large number of unseparated semiconductor dies 12, wherein each contact pad 54 (FIG. 6) is supported and electrically joined to a bond pad 20 by a plurality of conductive columns 50. Thus, the number of blind holes 44 to be etched may be, for example, two to nine (or more) times the number of bond pads/conductive sites 20 on which an FCDI 60 is to be formed. Each of the interconnect forming acts may be effected in the wafer stage.

In an alternative cross-sectional shape of hole 44, shown in FIG. 5A, the hole pattern 40 has four square holes in a 2×2 configuration. Four circular holes 44 in a 2×2 configuration are depicted in the bole pattern 40 of FIG. 5B, two rectangular holes 44 in a 2×1 arrangement are shown in the hole pattern 40 of FIG. 5C, and five elliptical holes 44 are illustrated in the 2,1,2 hole pattern 40 of FIG. 5D. From a practical standpoint, the number of holes 44 which are to be formed and filled as conductive columns 50 for a bond pad 20 is limited by the area of the bond pad surface 21, by the smallest hole size and pitch which may be achieved by currently available technology, and by the minimum hole size which may be effectively filled with conductive material.

The next general act of the exemplary method of creating an FCDI 60 is illustrated in FIG. 6, in which a conductive material is deposited in holes 44 of each hole pattern 40, filling the holes to form conductive columns 50. The conductive columns 50 generally extend from planar surface 34 of the first resist layer 30 to bond pad surface 21 of the bond pad 20. For example, copper may be deposited within the holes 44 by an electroless plating or electrolytic plating, the former being somewhat easier to effect. For example, exposed portions of the bond pad 20 within holes 44 are electroless plated until the holes 44 are filled. Methods for metal electroless plating are well known in the electronics art. During electroless plating of copper, copper ions are reduced to nickel by oxidation of the reducing agent. In an exemplary electroless (also termed autocatalytic) plating of copper over a seed layer or catalyst of, for example, palladium or tin-palladium deposited on the walls of holes 44, the substrate structure 10 may be first cleaned, then the seed layer or catalyst deposited and substrate structure 10 immersed in a bath containing an electroless copper plating solution to form the conductive columns 50. A wide variety of electroless copper plating solutions and systems are commercially available. Vendors of such plating solutions and systems include Cookson Electronics of Providence, Rhode Island, Transene Company, Inc. of Danvers, Massachusetts, Rohm & Haas Electronic Materials of Philadelphia, Pa. and Semitool, Inc. of Kalispell, Montana.

As shown in FIG. 6, the deposition, e.g., plating, process may be continued to form a cap or contact pad 54 extending over and connecting all of the conductive columns 50 formed in the hole pattern 40. The contact pad 54 may have a rounded, dome-like or mushroom-shaped surface 55 or may, optionally, be formed to have a surface which is generally flat, as will be described in more detail below.

As noted above, the material of conductive columns 50 may comprise a metal such as copper, an alloy, a metal containing polymer, or other somewhat resilient conductive material. If desired, the surface 55 of the contact pad 54 may be plated with a layer 56 of another material such as, for example, nickel or gold, as depicted in FIG. 7. Such a coating 56 may be applied to provide at least one of oxidation resistance, a harder surface, a solder-wettable surface, as well as for other reasons. In one embodiment, nickel is electrolessly applied, plating surface 55 of contact pad 54 to form a layer 56 thereon having a nickel thickness of about 10 µm or more. Methods for electroless plating of metal are well known in the electronics art. In an exemplary process for electroless plating of nickel over a copper surface 55, the substrate structure 10 may be first cleaned (specifically, surface 55 of contact pad 54) and then immersed in a bath containing an electroless nickel plating solution to form the nickel layer 56. The layer 56 of nickel acts as a wetting layer on contact pad 54, enabling molten solder to more effectively permit joinder to, e.g., a solder ball. A wide variety of electroless nickel plating solutions are known in the art, such as electroless nickel-phosphorus plating solutions or electroless nickel-boron plating solutions. Such electroless nickel plating solutions and systems are commercially available from PacTech GmbH (Berlin, Germany) and Rohm & Haas Electronic Materials (Philadelphia, Pa.). The electroless nickel solution may also include a reducing agent, an alkali for pH control, and complexing agents. During electroless plating, nickel ions are reduced to nickel by oxidation of the reducing agent. The nickel plating solution is maintained at a temperature range from about 60° C. to about 100° C. The concentration of nickel ion in the electroless plating solution, the plating temperature, and the time of exposure (immersion time) may be readily controlled to provide a desired thickness of finish layer 56. Electroless gold plating solutions are available from Transene Company, Inc. of Danvers, Massachusetts and PacTech GmbH (Berlin, Germany).

In the next act, illustrated in FIG. 8, first resist layer 30 is stripped from substrate active surface 22, including interstitial spaces 64, using any method suitable for the composition of first resist layer 30 as is known in the art. The resulting FCDI 60 has a contact pad 54 supported by a plurality of conductive columns 50 joined to bond pad surface 21 of a bond pad 20. In this embodiment, each exemplary conductive column 50 is shown with progressively thinner cross-sectional dimensions extending from the contact pad 54 to the bond pad 20. The net lateral flexibility of the FCDI 60 is defined by lateral movement of the contact pad 54 as a function of applied lateral force. The conductive columns 50 are generally slender, and have aspect ratios in the X direction and Y direction as follows:

$X$ dimension aspect ratio=(vertical dimension 32)/ (mean horizontal $X$ dimension).

$Y$ dimension aspect ratio=(vertical dimension 32)/ (mean horizontal $Y$ dimension).

In general, a typical average aspect ratio (vertical dimension 32/mean horizontal dimension) for a column of the invention is between about 3 and about 15, with a greater aspect ratio affording relatively greater flexibility. For many semiconductor die applications, a suitable aspect ratio may lie between about 5 and about 10. It is, of course, desirable to provide a sufficient number of columns 50 to preclude fracture of one or more columns 50 under a force applied along the Z-axis.

Figure 10:
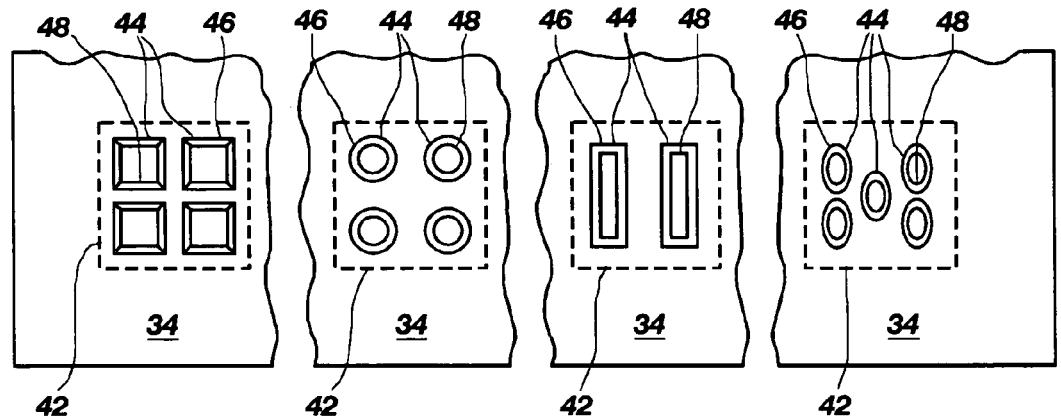
FIG. 10 is a perspective view of a portion of an exemplary substrate structure of FIG. 9 illustrating examples of two flexible column die interconnects, of the invention.
Figure 10:
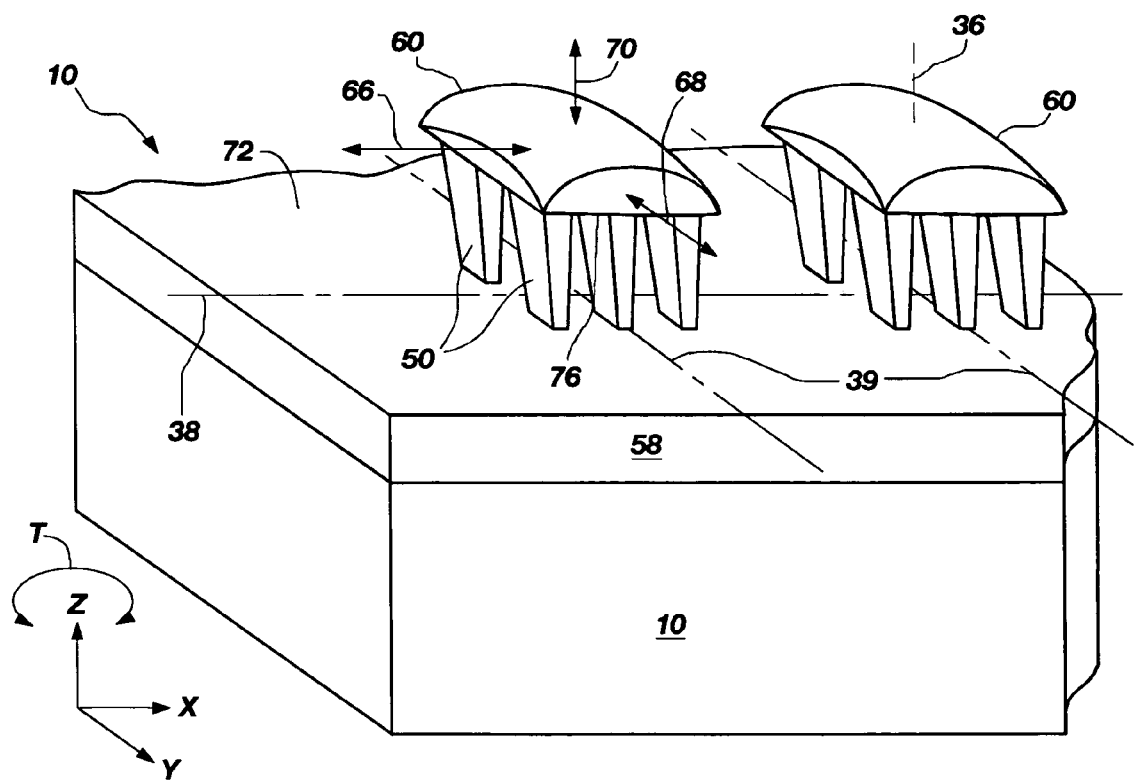

To mitigate the inherent flexibility of a given column height, width, taper, cross-sectional configuration and material to a more precise and lower value, a layer 58 of a passivating material such as polymer may be deposited on the stripped substrate active surface 22 including a lower portion of the interstitial space 64 between and about the conductive columns 50. As depicted in FIGS. 9 and 10, layer 58 may be applied to a controlled depth or thickness 62 which decreases the exposed (and to a certain extent, depending on the rigidity of the passivating material of layer 58) column length 63 and its flexibility or flexibilities in one or more directions to a desired value or values. In general, layer 58 may be applied to the entirety of substrate active surface 22 by a spin-on technique or other suitable method to achieve a generally planar surface 65. The layer 58 is preferably formed of a material which also passivates and protects the substrate surface, e.g., active surface 22. The layer 58 is preferably comprised of a dielectric polymer which, in this embodiment, has a relatively low pliancy (relatively high rigidity) within the range of pliancies of commonly used dielectric passivating polymers. Thus, such polymeric materials such as various polyimides, which are easily flowable, may be used although other organic materials such as benzocyclobutene and PARYLENE™ polymers may be used. Epoxies such as, for example, Loctite (Dexter) HYSOL® FLUXFILL™ 2000 and 2300 underfills may also be employed. The polymer is preferably chosen to be conformal, have a pliancy (when cured) which provides an FCDI 60 with desired flexibility value(s) at a desired polymer depth 62, and be capable of forming and maintaining a planar surface 72 upon curing or hardening to at least a semisolid state. Flexibilities (strain/stress) of the contact pad 54 are shown in FIG. 10 to include X-axis flexibility 66, that is, flexibility parallel to the X-axis; Y-axis flexibility 68; and Z-axis flexibility 70. Torsional flexibility T about the Z-axis may also be considered. In the present discussion, the X-axis is represented by center line 38 which passes through an entire straight row of FCDIs 60; X-axis flexibility 66 is significant to maintaining separation of adjacent interconnects. The maximum Y-axis flexibility 68 along center line 39 may be less critical inasmuch as interconnect flexing along the Y-axis is not in the direction of other contactable FCDIs 60. Z-axis flexibility permits a measurable degree of non-planarity in the field of contact pads 54 and/or in the field of connectors of a superimposed substrate to which the contact pads 54 are to be joined.

Although the flexibility values are calculable using conventional structural mathematical methods, the desired flexibilities may also be determined experimentally. In any case, excessive flexibility 66, 68, and/or 70 of an interconnect contact pad 54 may be mitigated by selecting a cured polymer depth 62 and pliancy (or rigidity) which limits movement of conductive columns 50 and contact pad 54 to desirable values in the X, Y and/or Z axes.

Figure 18:
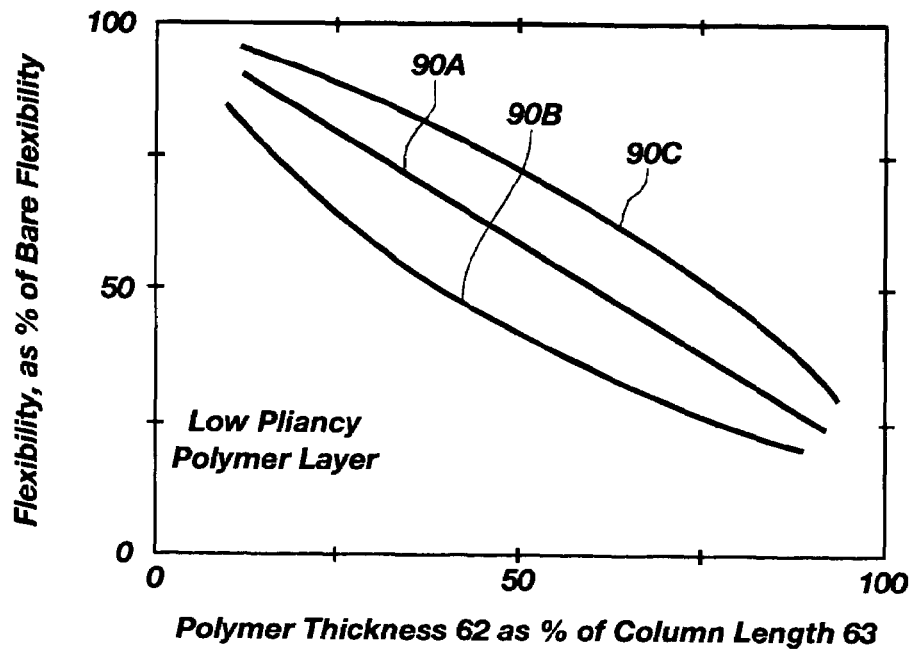
FIG. 18 is a graphical depiction of a generalized relationship between polymer thickness and resulting flexibility using a low pliancy polymer layer of a method of the invention.
Figure 19:
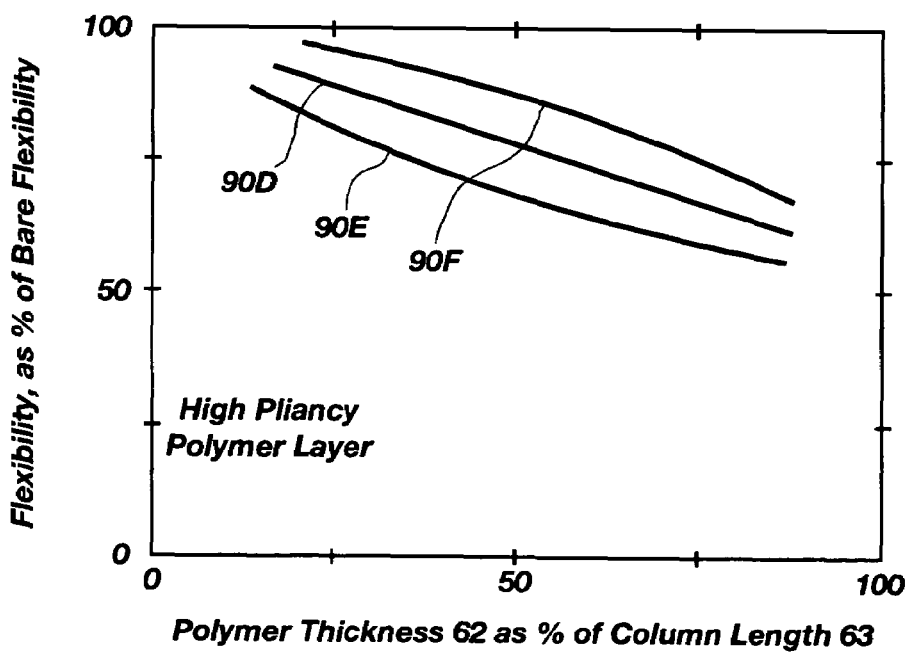
FIG. 19 is a graphical depiction of a generalized relationship between polymer thickness and resulting flexibility using a high pliancy polymer layer of a method of the invention.

As shown in FIGS. 18 and 19, hypothetical contact pad flexibility values 90A-90F using a low pliancy polymer (FIG. 18) and a high pliancy polymer (FIG. 19) may be compared, as a function of polymer thickness 62. In actuality, the flexibilities are (as noted above) also a function of the column cross-sectional shape, column length 63, column aspect ratio, change in shape with column length 63, and the mechanical properties of the conductive material from which the conductive columns 50 are formed. In the figures, hypothetical contact pad flexibility values 90A and 90D are shown as having a generally linear relationship. Contact pad flexibility values 90B and 90E illustrate the effect of conductive columns 50 shaped with a greater cross-sectional area at the distal end 76. Contact pad flexibility values 90C and 90F exemplify the effect of conductive columns 50 shaped with a greater cross-sectional area at the base end 78. A polymer layer 58 of higher pliancy will, of course, have less effect upon the net flexibility of a contact pad 54 than a polymer layer 58 of lower pliancy.

Turning now to FIGS. 11 through 17, another embodiment of the invention will be described and illustrated. In this embodiment, the method uses the acts already described and shown in FIGS. 1 through 5 (including the alternatives of FIGS. 5A through 5E). In the embodiment of FIGS. 11 through 17, a second photolithographic process is conducted to precisely define the shape and size of the contact pad 54.

Figure 11:
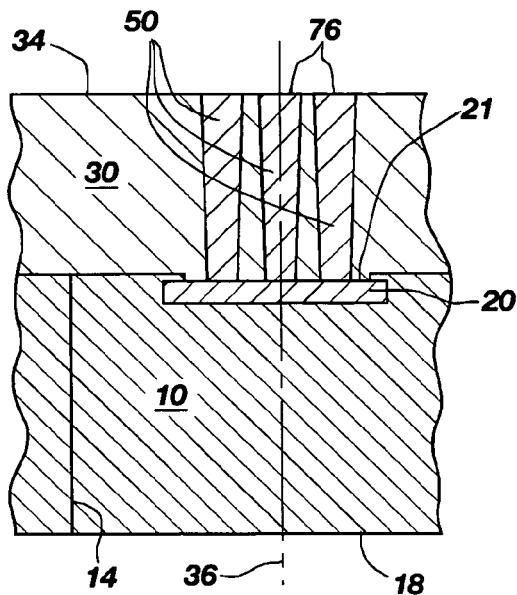
FIG. 11 is a cross-sectional lateral view of a portion of an exemplary substrate structure of FIG. 5 following filling of a plurality of openings with a conductive material to form conductive columns joined to a bond pad, of an act of another embodiment of the methods of the invention.
Figure 12:
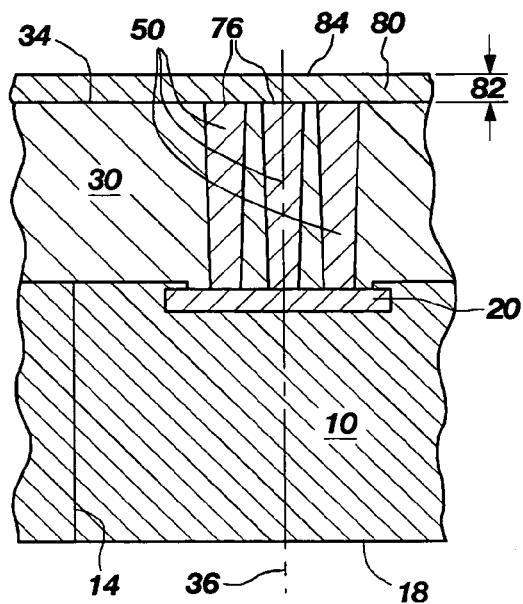
FIG. 12 is a cross-sectional lateral view of a portion of an exemplary substrate structure of FIG. 11 following deposition of a second layer of resist over the first layer of resist and second ends of the columns, of an act of another embodiment of a method of the invention.

As shown in FIG. 11, the blind holes 44 in the first resist layer 30 are filled with a conductive material to form conductive columns 50 which terminate substantially at the planar surface 34, using a method as previously described.

A second resist layer 80 is then applied (see FIG. 12) over the first resist layer 30 to a thickness 82, generally corresponding to the desired thickness of a contact pad 54 to be formed over the distal ends 76 of the conductive columns 50.

Figure 13:
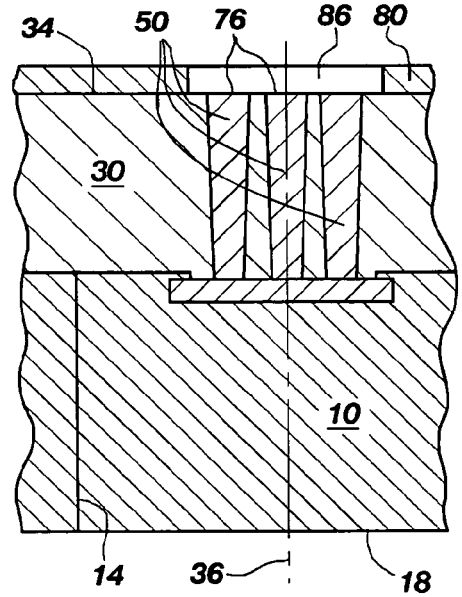
FIG. 13 is a cross-sectional lateral view of a portion of an exemplary substrate structure of FIG. 12 following patterning and developing the second resist layer to form a cavity extending to the second ends of the plurality of columns, of another embodiment of a method of the invention.
Figure 14:
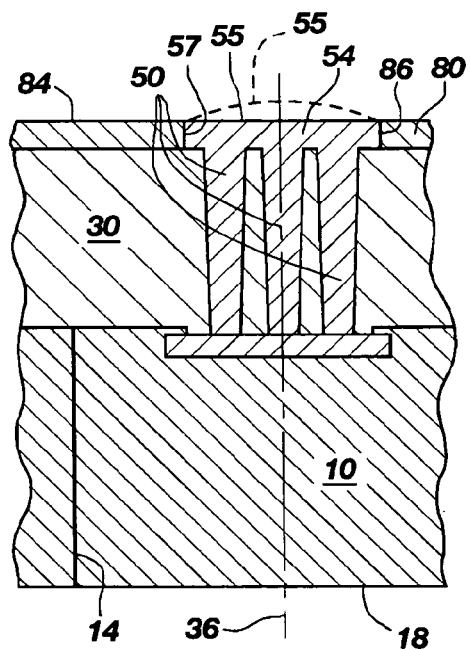
FIG. 14 is a cross-sectional lateral view of a portion of an exemplary substrate structure of FIG. 13 following deposition of a conductive material in the cavity to form a contact pad joined to the second, outer ends of a plurality of columns, of a method of the invention.

As depicted in FIG. 13, the second resist layer 80 is then patterned and developed to form an aperture 86 of a desired shape and size, and the periphery of which encompasses the distal ends 76. The contact pad 54 is then formed by electroless plating or electrolytic plating of a conductive material, forming a pad surface 55 (see FIG. 14) which may be domed (mushroom cap shape) as shown in broken lines extends above upper surface 84 of second resist layer 80, and which may exhibit a peripheral sidewall 57 in lieu of the domed pad surface 55 meeting the undersurface of the contact pad 54. If a generally flat or planar surface is desired, contact pad 54 may be plated to a dome shape extending above second resist layer 80 (and thus having the aforementioned peripheral sidewall 57 and substrate structure 10 subjected to an abrasive planarization technique such as chemical mechanical planarization (CMP) to planarize the tops of contact pads 54, the upper surface of second resist layer 80 acting as a stop for the CMP process.

Figure 15:
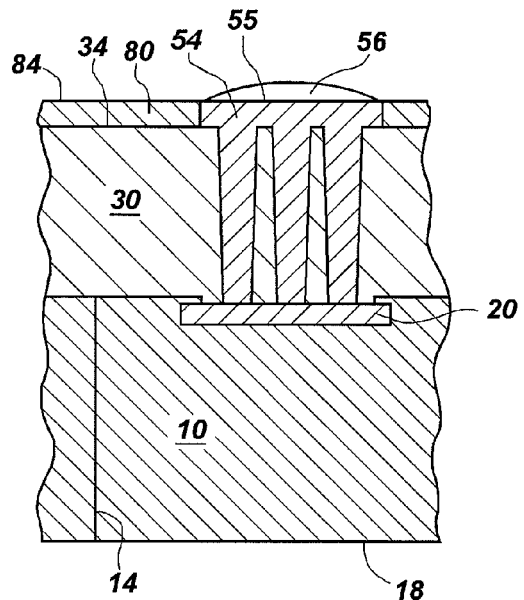
FIG. 15 is a cross-sectional lateral view of a portion of an exemplary substrate structure of FIG. 14 following application of a conductive cap of the contact pad, in an optional act of a method of the invention.

FIG. 15 shows an optional step of plating the pad surface 55 with a finish layer 56 such as nickel or gold, for example. Finish layer 56 may be domed, as shown, or merely provide a thin, conformal layer on the surface 55 of contact pad 54. The finish layer 56 may act as a physical protection layer for use with probe or burn-in test pins or other contacts, or as a solder wettable layer for attachment to a solder ball or the like, as known in the art.

Figure 16:
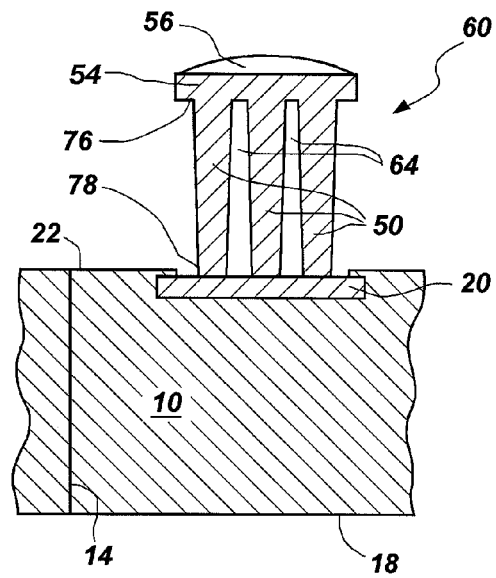
FIG. 16 is a cross-sectional lateral view of a portion of an exemplary substrate structure of FIG. 15 following stripping of both resist layers, in accordance with a method of the invention.

As shown in FIG. 16, the two resist layers 30, 80 are then stripped from the substrate active surface 22, exposing the FCDI 60 with a relatively high degree of contact pad flexibility 90.

Figure 17:
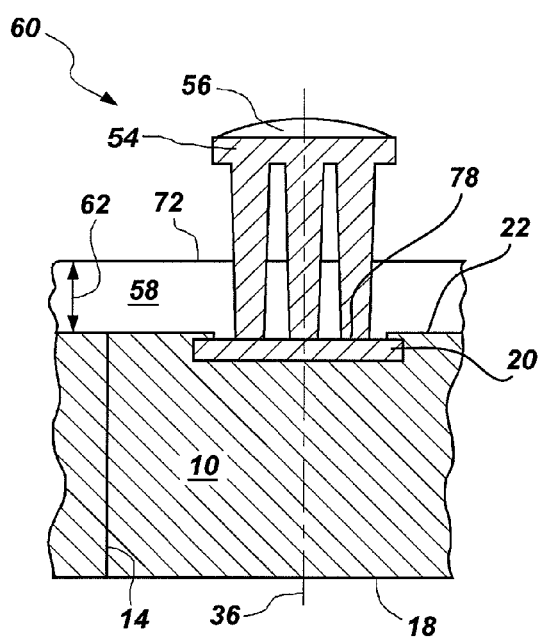
FIG. 17 is a cross-sectional lateral view of a portion of an exemplary substrate structure of FIG. 16 following an optional step of deposition of a layer of dielectric material over the active surface to mitigate flexibility of the contact pad and form a flexible column die interconnect (FCDI) having a desired flexibility, of a method of the invention.

If it is desired to mitigate the contact pad flexibilities 90 to a lower value, a layer 58 of polymer or other passivating material, as previously described, is applied in a generally planar application to a uniform depth 62 surrounding the conductive columns 50, including interstitial spaces 64. As depicted in FIG. 17, layer 58 also acts to support the column base ends 78 (inhibiting separation from the bond pad 20) and may act as a final passivation layer over the active surface 22.

Figure 17A:
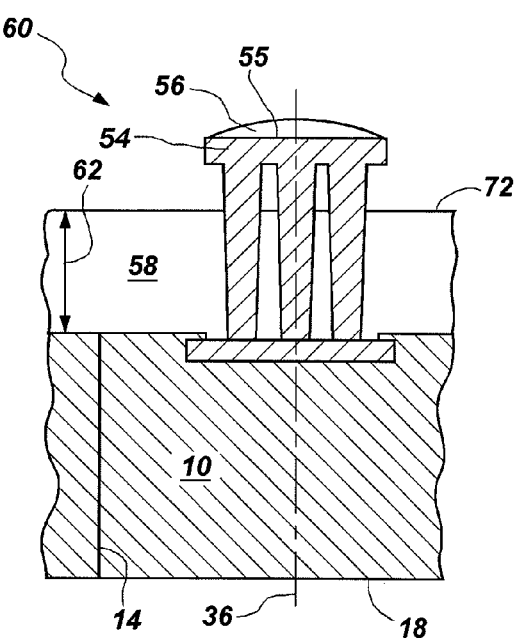
FIG. 17A is a cross-sectional lateral view of a portion of an exemplary substrate structure of FIG. 16 following an optional act of deposition of a relatively thick layer of dielectric material over the active surface and around the columns to mitigate flexibility of the contact pad and form a FCDI, of a method of the invention.

FIG. 17A depicts the same FCDI 60 as in FIG. 17, but the active surface 22 is covered with a deeper layer 58. If the materials used to form layer 58 of FIG. 17 and deeper layer 58 of FIG. 17A have the same pliancy, the FCDI 60 of FIG. 17A will have less flexibility. Its flexibility may be increased by using a polymer layer 58 of increased pliancy. Such materials are known in the art.

Where wafer testing or die testing reveals, however unlikely due to the redundancy provided by the use of multiple columns 50, that a particular interconnect is defective, the individual interconnect may be readily reworked using the same processes by which it was originally formed of the method of the invention.

The methods of the invention provide interconnects for wafer level packaging which may eliminate the need for underfill, provide a redundancy of electrical paths for each interconnect; be completed at the wafer level, enable robust testing at the wafer level, permit a desired degree of flexibility of the contact pads in lateral and axial directions to minimize the effects of thermal mismatches and accommodate inadvertent application of excessive force to the interconnects during handling, testing and assembly, eliminate the need for an interposer and permit rework of individual defective interconnects, using the processes of the invention as described.

As already indicated, methods of the invention avoid the use of wire bonding. Thus, the high forces which may be inadvertently applied by a wire bonding capillary are absent, eliminating a potential cause of device failure. In addition, the invention enables assembly of stacked dies and multi-chip modules (MCM) at high speed and accuracy while reducing the occurrence of defects. The method is designed to be completed at the wafer level, thus saving both manufacturing time and costs, including materials costs.

The present invention has been described in specific embodiments intended in all respects to be illustrative rather than limiting in nature. It is to be understood that the invention defined by the appended claims is not to be limited by specific details set forth in the above description and that alternative embodiments will become apparent to those of ordinary skill in the art to which the invention pertains without departing from the spirit and scope thereof.

What is claimed is:

1. A method for forming at least one interconnect on a substrate structure, the method comprising:
   providing a substrate structure including a surface bearing at least one conductive terminal;
   applying a material onto the substrate surface and over the at least one conductive terminal;

forming a plurality of holes extending through the material to a surface of the at least one conductive terminal;

filling the holes of the plurality with a first conductive material to form a plurality of columns, each column having a base end conductively joined to the at least one conductive terminal, and an opposed outer end and, when the plurality of columns are completed;

applying another material comprising an aperture exposing a surface of each of the columns of the plurality;

depositing a second conductive material over a surface of the material to join the outer ends of the plurality of columns and form a contact pad at least partially within the aperture; and removing the another material from around the contact pad and the material from the substrate surface and from around the plurality of columns.

2. The method of claim 1, further comprising selecting the substrate structure to comprise a semiconductor wafer and the at least one conductive terminal to comprise a bond pad.

3. The method of claim 1, further comprising forming the plurality of holes in substantially mutually parallel orientation.

4. The method of claim 1, further comprising selecting the first conductive material and the second conductive material to comprise the same material.

5. The method of claim 1, further comprising forming the plurality of holes by patterning and developing the material.

6. The method of claim 1, further comprising forming the plurality of holes by laser ablation.

7. The method of claim 1, further comprising forming the holes of the plurality to have an aspect ratio of between about 3.0 and about 15.0.

8. The method of claim 1, further comprising forming the holes of the plurality to have an aspect ratio of between about 5.0 and 10.0.

9. The method of claim 1, further comprising forming the holes of the plurality to have a transverse cross-sectional shape comprising one of rectangular, square, triangular, circular, and elliptical.

10. The method of claim 1, further comprising forming the columns of the plurality to have substantially straight sidewalls and to be of greater transverse cross-sectional area at the outer end than at the base end.

11. The method of claim 1, further comprising forming the columns of the plurality to have substantially straight sidewalls and to be of greater transverse cross-sectional area at the base end than at the outer end.

12. The method of claim 1, further comprising forming the columns to have a generally uniform transverse cross-sectional area between the base end and the outer end.

13. The method of claim 1, further comprising:

applying a dielectric material at a selected depth to the substrate surface and surrounding at least a base portion of each of the plurality of columns.

14. The method of claim 13, further comprising curing the dielectric material to at least a semisolid state.

15. The method of claim 13, further comprising applying the dielectric material using a spin-on process.

16. The method of claim 1, further comprising selecting the substrate structure to comprise one of a semiconductor wafer, a semiconductor die, an interposer substrate, a probe card, a burn-in contact head and a circuit board.

17. The method of claim 1, further comprising selecting the surface of the substrate structure to comprise an active surface of one of a semiconductor wafer and semiconductor die.

18. The method of claim 1, further comprising selecting the material to comprise a resist material.

19. The method of claim 18, further comprising selecting the resist material to comprise one of a negative photoresist material and a positive photoresist material.

20. The method of claim 1, further comprising plating at least an upper surface of the contact pad with a metal material.

21. The method of claim 20, wherein plating at least an upper surface of the contact pad with a metal material is effected before removing the material from the substrate surface and from around the plurality of columns.

22. The method of claim 1, further comprising:

forming the aperture in the another material having a periphery encompassing the plurality of holes through the material extending to the surface of the at least one conductive terminal;

depositing the second conductive material within the periphery of the aperture; and removing the another material concurrently with removing the material.

23. The method of claim 22, further comprising selecting the another material to comprise a resist material.

24. The method of claim 23, further comprising selecting the resist material to comprise one of a negative photoresist material and a positive photoresist material.

25. The method of claim 22, further comprising plating at least an upper surface of the contact pad with a metal material.

26. The method of claim 22, wherein plating at least an upper surface of the contact pad with a metal material is effected before removing the another material.

27. The method of claim 22, wherein applying the another material is effected after the plurality of columns is formed.

28. The method of claim 22, further comprising selecting the first conductive material and the second conductive material to comprise the same material.

29. The method of claim 22, further comprising forming the aperture by patterning and developing the another material.

30. The method of claim 22, further comprising depositing the second material to a level above the another material.

31. The method of claim 30, further comprising planarizing the deposited second layer of material at least to the another material.

* * * * *

UNITED STATES PATENT AND TRADEMARK OFFICE
CERTIFICATE OF CORRECTION

PATENT NO.         : 7,491,636 B2
APPLICATION NO.    : 11/184119
DATED              : February 17, 2009
INVENTOR(S)        : Farnworth It is certified that error appears in the above-identified patent and that said Letters Patent is hereby corrected as shown below:

On the title page, in field (74), in "Attorney, Agent or Firm", in column 2, line 1, delete "TrackBritt" and insert -- TraskBritt --, therefor.

Signed and Sealed this

Twenty-first Day of April, 2009

JOHN DOLL
*Acting Director of the United States Patent and Trademark Office*